(12) United States Patent
Devulapalli et al.

(10) Patent No.: US 12,052,016 B2
(45) Date of Patent: Jul. 30, 2024

(54) RECOGNIZING TRANSISTOR-TRANSISTOR LOGIC LEVELS (TTL) AT AN INPUT CIRCUIT WITH INCREASED IMMUNITY TO STATIC CURRENT DRAW

(71) Applicant: Microchip Technology Incorporated, Chandler, AZ (US)

(72) Inventors: Sridhar Devulapalli, Colorado Springs, CO (US); Daniel J. Russell, Colorado Springs, CO (US); Brian Cherek, Colorado Springs, CO (US); Michael Klein, Colorado Springs, CO (US)

(73) Assignee: Microchip Technology Corporation, Chandler, AZ (US)

( * ) Notice: Subject to any disclaimer, the term of this patent is extended or adjusted under 35 U.S.C. 154(b) by 0 days.

(21) Appl. No.: 17/304,621

(22) Filed: Jun. 23, 2021

(65) Prior Publication Data
US 2021/0409024 A1    Dec. 30, 2021

Related U.S. Application Data

(60) Provisional application No. 62/705,384, filed on Jun. 24, 2020.

(51) Int. Cl.
*H03K 19/0185* (2006.01)
*H03K 3/037* (2006.01)
*H03K 19/00* (2006.01)

(52) U.S. Cl.
CPC ..... *H03K 19/018521* (2013.01); *H03K 3/037* (2013.01); *H03K 19/0013* (2013.01)

(58) Field of Classification Search
CPC ............ H03K 19/0013; H03K 19/018521
See application file for complete search history.

(56) References Cited

U.S. PATENT DOCUMENTS

| | | |
|---|---|---|
| 3,654,394 A | 4/1972 | Gordon |
| 4,577,149 A | 3/1986 | Zbinden |
| | (Continued) | |

FOREIGN PATENT DOCUMENTS

| | | |
|---|---|---|
| EP | 0546702 A1 | 6/1993 |
| EP | 0667678 A2 | 8/1995 |
| | (Continued) | |

OTHER PUBLICATIONS

International Written Opinion from International Application No. PCT/US2021/07076, mailed Nov. 29, 2021, 10 pages.
(Continued)

*Primary Examiner* — Patrick O'Neill
(74) *Attorney, Agent, or Firm* — TraskBritt (57) ABSTRACT

An input circuit that recognizes (e.g., buffers) logic level signals (e.g., of an input signal) represented by voltage levels that are lower than a supply voltage of an input circuit, and that exhibits static current draw immunity during stable states of an input signal. In one or more examples, series inverters are provided to buffer an input node and an output node of the input circuit. A voltage domain at the input circuit or output node may be higher than a voltage domain at the input node. Power supply to a first inverter of the series inverters may be turned OFF at least partially responsive to an indication that an output signal is a logic high; and power supply to the first inverter of the series inverters may be turned ON at least partially responsive to an indication that the output signal is a logic low. A third inverter may be maintained utilizing an input signal voltage to detect a falling edge of the input signal and turn ON power supply to the first inverter at least partially responsive thereto.

14 Claims, 7 Drawing Sheets

(56) References Cited

U.S. PATENT DOCUMENTS

| | | | |
|---|---|---|---|
| 5,151,620 A * | 9/1992 | Lin | H03K 19/018521 326/71 |
| 5,552,627 A | 9/1996 | McCollum et al. | |
| 6,323,704 B1 | 11/2001 | Pelley et al. | |
| 6,326,803 B1 | 12/2001 | Takeda | |
| 6,429,683 B1 * | 8/2002 | Miller | H03K 19/018521 363/60 |
| 7,023,238 B1 | 4/2006 | Camarota | |
| 7,098,689 B1 | 8/2006 | Tuan et al. | |
| 7,295,459 B2 | 11/2007 | Mujahid | |
| 7,382,168 B2 | 6/2008 | Bhattacharya et al. | |
| 8,471,803 B2 * | 6/2013 | Jeon | H03K 19/018521 327/333 |
| 8,633,730 B1 | 1/2014 | Tseng et al. | |
| 8,929,125 B2 | 1/2015 | Keeth et al. | |
| 9,001,578 B2 | 4/2015 | Kim et al. | |
| 9,360,928 B2 | 6/2016 | Pedersen et al. | |
| 9,369,124 B2 | 6/2016 | Gunther et al. | |
| 9,865,342 B2 | 1/2018 | Lee | |
| 10,819,318 B1 | 10/2020 | Britton et al. | |
| 2002/0118040 A1 * | 8/2002 | Salminen | H03K 19/018521 326/81 |
| 2003/0016051 A1 | 1/2003 | El-Ayat | |
| 2003/0189847 A1 | 10/2003 | Liu et al. | |
| 2006/0023503 A1 | 2/2006 | Lee | |
| 2006/0261862 A1 * | 11/2006 | Baszler | H03K 19/0013 327/333 |
| 2007/0075737 A1 | 4/2007 | Schmit et al. | |
| 2008/0084237 A1 * | 4/2008 | Behrends | H03K 19/018521 327/333 |
| 2008/0204289 A1 | 8/2008 | Miettinen | |
| 2008/0205112 A1 | 8/2008 | Lawson et al. | |
| 2008/0253180 A1 | 10/2008 | Nicolaidis et al. | |
| 2009/0206875 A1 | 8/2009 | Tran et al. | |
| 2009/0303650 A1 | 12/2009 | Do et al. | |
| 2011/0001108 A1 | 1/2011 | Greene et al. | |
| 2011/0176357 A1 | 7/2011 | Koyama et al. | |
| 2012/0063211 A1 | 3/2012 | Sharma et al. | |
| 2013/0069905 A1 | 3/2013 | Krah et al. | |
| 2013/0126957 A1 | 5/2013 | Higashitani et al. | |
| 2013/0308373 A1 | 11/2013 | Shukh | |
| 2014/0002162 A1 | 1/2014 | Westwick | |
| 2016/0329098 A1 | 11/2016 | Javerliac et al. | |
| 2016/0351498 A1 | 12/2016 | Chang et al. | |
| 2018/0101495 A1 | 4/2018 | Mackay et al. | |
| 2018/0268878 A1 | 9/2018 | Ogiwara et al. | |
| 2018/0287614 A1 | 10/2018 | Jo et al. | |
| 2019/0228825 A1 | 7/2019 | Hecht et al. | |
| 2019/0229734 A1 | 7/2019 | Hecht et al. | |
| 2019/0237139 A1 | 8/2019 | McCollum et al. | |
| 2019/0341844 A1 | 11/2019 | Singh et al. | |
| 2020/0409879 A1 | 12/2020 | Hull et al. | |

FOREIGN PATENT DOCUMENTS

| | | |
|---|---|---|
| EP | 1237278 A1 | 9/2002 |
| EP | 3115869 B1 | 5/2018 |
| WO | 2007/140031 A2 | 12/2007 |
| WO | 2011/062075 A1 | 5/2011 |
| WO | 2017/019715 A1 | 2/2017 |
| WO | 2019/152228 A1 | 8/2019 |

OTHER PUBLICATIONS

Microchip ATECC608A, CryptoAuthentication(TM) Device Summary Datasheet, DS40001977B (2018) 28 pages.

* cited by examiner

RECOGNIZING TRANSISTOR-TRANSISTOR LOGIC LEVELS (TTL) AT AN INPUT CIRCUIT WITH INCREASED IMMUNITY TO STATIC CURRENT DRAW

CROSS-REFERENCE TO RELATED APPLICATION

This application claims the benefit under 35 U.S.C. § 119(e) of U.S. Provisional Patent Application Ser. No. 62/705,384, filed Jun. 24, 2020, the disclosure of which is hereby incorporated herein in its entirety by this reference.

FIELD

Disclosed examples relate, generally, to input circuits, and more specifically, to input circuits for interfacing an integrated circuits (IC) with different voltage domains.

BACKGROUND

An input and output (IO) pin is digital signal pin, committed or uncommitted, in an integrated circuit (IC), such as a microcontroller without limitation. Since an uncommitted IO pin has no predefined purpose, the purpose and behavior of the IO pin may be defined and implemented by a designer of a higher level system or circuitry. Typically, an IO pin can be associated with an input, an output, or both, and with a specified supply voltage. Typically, when choosing an external device to interface with a microcontroller via an IO pin, an external device is chosen that uses logic voltage levels (i.e., voltage levels associated with digital signals) close to a supply voltage of the IO pin or vice versa.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example nor this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to examples of the present disclosure.

The examples may be described in terms of a process that is described or depicted as a flow process, flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

Signal states are sometimes represented by voltage levels. As a non-limiting example, predetermined voltage levels are utilized to represent signal states that correspond to a logical '1' or logical '0' utilized in binary representation of information, and such voltages referred to herein as logic levels. Different predetermined voltage levels are utilized for different types of logic, such as for Bipolar junction transistors (BJT) type logic and field effect transistor (FET), metal-oxide FET (MOSFET) or complementary metal oxide semiconductor (CMOS) type logic, without limitation.

Transistor-transistor-logic (TTL) levels traditionally referred to the voltage levels utilized by circuits of BJT type logic to interface with each other via logic level signaling. Since BJT type logic was a forerunner technology, many systems implementing FET and CMOS type logic use TTL levels for logic level signals.

TTL typically uses a 5 volt logic convention where a minimum voltage level is specified for a logic high and maximum voltage level is specified for a logic low. As a non-limiting example, given an input signal represented by a 5 volt TTL the minimum voltage level to recognize a logic high might be substantially 1.5 to 2.0 volts and the maximum voltage level for a logic low might be substantially 0.5 to 1.0 volts. Specific minimums and maximums are often set within these ranges for specific applications. Voltage level minimums and maximums that are different then specified minimums and maximums are often utilized to represent output signals to provide some margin for noise between an output signal and a corresponding input signal.

To detect the voltage levels representing an input signal, an IC may utilize supply voltages and device thresholds of transistors (e.g., a device comprised of a BJT, FET, MOSFET, and CMOS, without limitation). When a voltage level of an input signal is at a transistor's action threshold (e.g., trip point for MOSFETs and CMOS, without limitation), the transistor's device will turn ON and provide a voltage that corresponds to a voltage rail (a voltage level of a voltage rail is the voltage level of the supply voltage) that is used internally to the IC to represent logical states of a signal.

Input circuits are sometimes utilized as interfaces between different voltage domains to buffer input signals that will be represented by different logic level voltages at the different voltage domains. In a case where a TTL logic signal is received at an input circuit that utilizes CMOS logic signals, the signal is represented at an input by TTL voltages, and represented at an output by CMOS voltages (typically the supply voltage of the input circuit).

Series inverters coupled between an input node and an output node are sometimes utilized to implement an input circuit. In an inverter that utilizes enhancement CMOS transistors, an NMOS and a PMOS transistor are arranged in a same logic gate, with the source terminal of the PMOS transistor coupled to VDD, the source terminal of the NMOS transistor coupled to GND, respective drain terminals coupled to an output terminal of the inverter, and respective gate terminals coupled to an input terminal of the inverter. In the presence of a voltage that represents a logic high at the inverter input terminal (and so at the respective gate terminals of the NMOS and PMOS transistors), the PMOS transistor is OFF and the NMOS transistor is ON and pulls down a voltage at the inverter output terminal to GND. In the presence of a voltage that represents a logic low at the inverter input terminal (and so at the respective gate terminals of the NMOS and PMOS transistors), the NMOS transistor is OFF and the PMOS transistor is ON and pulls up a voltage at the inverter output terminal to VDD.

When a logic high input signal is represented a voltage that is below a supply voltage of the input circuit, but above an action threshold of the PMOS transistor of a first (or "input") inverter of the series inverters, then a voltage potential across the transistor may induce a static current draw having a non-negligible magnitude and noticeable impact on power consumption, which can be reflected as a static current draw or DC current consumption by the transistor device.

Typically, static current draw is tolerated by designers. In some applications, such as battery operated or low power consumption/sleep mode applications, without limitation, the inventors of this disclosure appreciate it may be desirable to control static current draw to reduce or eliminate power consumption or preserve power.

One or more examples relate, generally, to reducing or eliminating static current draw at an input circuit due to interfacing with a circuit that is at a different voltage domain. In one or more examples, power supply to a first inverter of series inverters is turned OFF at least partially responsive to an indication that an output signal is a logic high and turned ON at least partially responsive to an indication that the output signal is a logic low. While power supply to the first inverter is turned OFF, the PMOS transistor is completely OFF.

Figure 1:
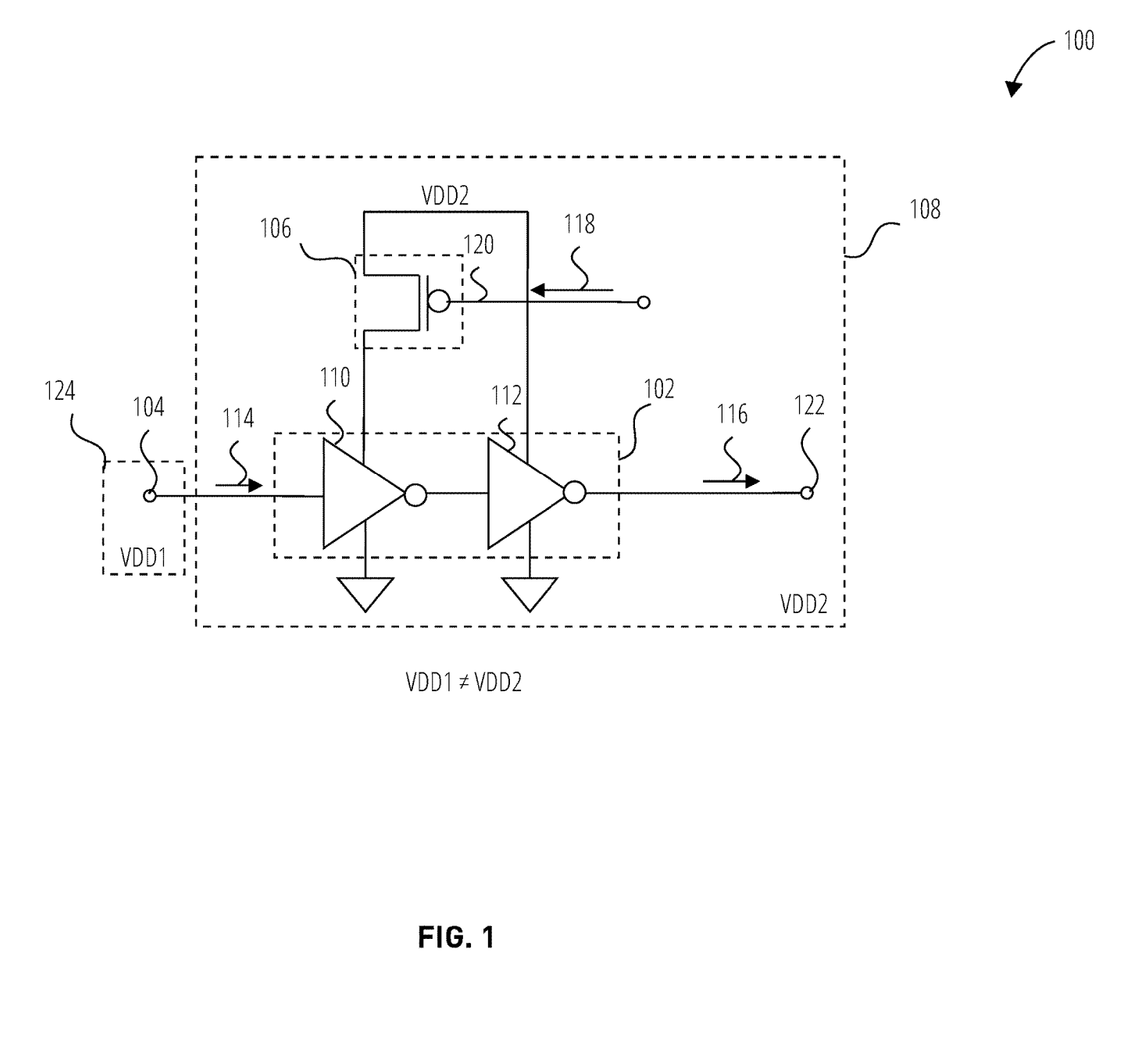
FIG. 1 is a schematic diagram depicting an input circuit for buffering an input signal, in accordance with one or more examples.

FIG. 1 is a schematic diagram depicting an input circuit 100, in accordance with one or more examples. Input circuit 100 includes series inverters 102 to provide a buffer for input signal 114 between input node 104 and an output node 122, where a voltage domain 108 (VDD2) of the input circuit 100 and output node 122 is higher than a voltage domain 124 (VDD1) of input node 104 (i.e., VDD2>VDD1). As a non-limiting example, VDD1 may be for a circuit that utilizes logic levels where a voltage for a logic high is not within a threshold voltage of VDD1 (e.g., an inter-integrated circuit (I2C) bus, without limitation), a universal asynchronous receiver-transmitter (UART) that utilizes logic levels where a voltage for a logic high is not within a threshold voltage of VDD1, or any other circuit that utilizes logic levels where a voltage for a logic high is not within a threshold voltage of VDD1 or in cases where the voltage levels for a logic high of a received input signal are not within a threshold voltage of VDD2, as a non-limiting example, due to attenuation of an input signal 114 or a transmitted signal to which input signal 114 corresponds.

In one or more examples, input circuit 100 is configured, generally, to turn OFF power supply to first inverter 110 provided at input node 104, which is an input to series inverters 102 responsive to a logic high input signal 114, and turn ON power supply to first inverter 110 responsive to a logic low input signal 114.

Input circuit 100 includes series inverters 102 coupled to provide a buffer between input node 104 and output node 122. First inverter 110 and second inverter 112 of series inverters 102 are arranged to provide an output signal 116 that is a buffered input signal 114. Input circuit 100 includes power switch 106 to selectively couple supply voltage VDD2 to first inverter 110 (i.e., a supply lead of first inverter 110). Second inverter 112 (i.e., a supply lead of second inverter 112) is directly coupled to supply voltage VDD2 to continuously maintain second inverter 112.

First inverter 110 and second inverter 112 are configured to generate respective output signals that are inverted versions of respective input signals. In a contemplated operation, first inverter 110 generates an inverted input signal 114 represented by a voltage that is the VDD2 version of the logical compliment of the VDD1 voltage representing a state of input signal 114. First inverter 110 detects a state of input signal 114 at least partially responsive to an increasing or decreasing voltage level exhibited at its inverter input, where an increasing voltage level is indicative of a rising edge of input signal 114 (i.e., of a state transition from a logic low to a logic high) and a decreasing voltage level is an indication of falling edge of input signal 114 (i.e., of a state transition from a logic high to a logic low). Second inverter 112 similarly detects a state of the inverted input signal 114 generated by first inverter 110 and generates a signal that corresponds to input signal 114 except represented by voltage levels that correspond to VDD2.

In one or more examples, thresholds for detecting increasing and decreasing voltages may be chosen, for example, to be indicative of a minimum voltage level or a maximum voltage level pre-specified to represent a logic low or a logic high, e.g., 1.5 volts to represent a logic high and 0.5 volts to represent a logic low.

In one or more examples, supply voltage VDD2 to first inverter 110 is turned ON or OFF by power switch 106. Power switch 106 is turned ON and OFF by assertions and de-assertions, respectively, of enablement terminal 120. Here, the signal used to assert/de-assert enablement terminal 120 is indication 118, which is indicative of a state (logic high or logic low) of output signal 116 at output node 122 and therefore indicative of a state of input signal 114. In a case where enablement terminal 120 is active low and passive high, power switch 106 turns OFF at least partially responsive to indication 118 exhibiting a logic high and power is not supplied to first inverter 110, power switch 106 turns ON at least partially responsive to indication 118 exhibiting a logic low and power is supplied to first inverter 110.

When input signal 114 is logic high, series inverters 102 generate a corresponding logic high output signal 116 at output node 122. Indication 118 is set as a logic high/de-assertion that turns OFF power switch 106 and turns OFF power supply to first inverter 110.

When first inverter 110 is turned OFF, a state of output signal 116 is latched, at least in part, because upon power supply being OFF, first inverter 110 cannot generate a logic high signal in response to a falling edge of input signal 114, or more specifically, in response to decreasing voltages levels at its input indicative of a falling edge of input signal 114. Moreover, neither a falling edge of input signal 114, nor indication thereof, is exhibited at an input of second inverter 112.

Figure 2A:
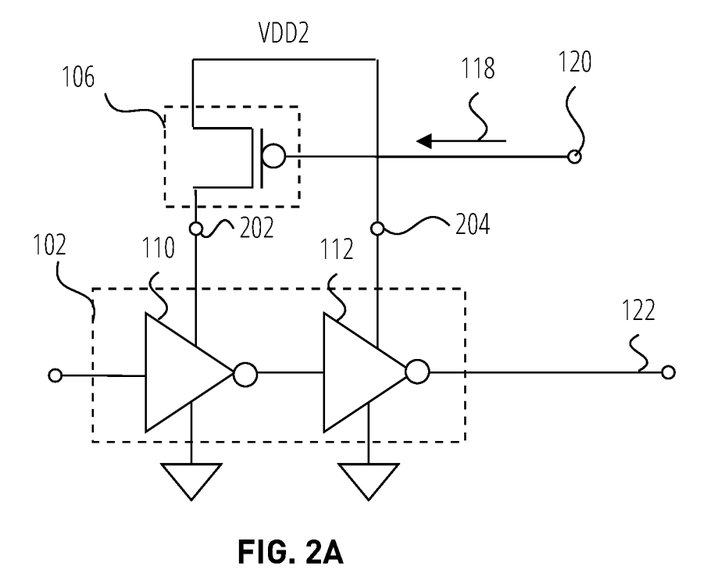
FIG. 2A is a schematic diagram depicting input circuit and respective power supply leads of first inverter and second inverter of FIG. 1.
Figure 2B:
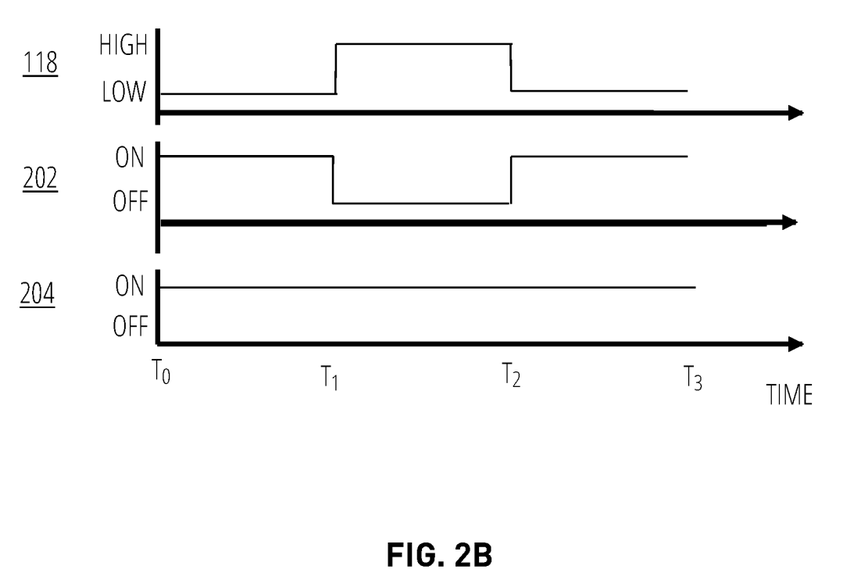
FIG. 2B is a signal timing diagram depicting maintenance of respective leads of first inverter and second inverter.

FIG. 2A is a schematic diagram depicting input circuit 100 and power supply leads 202 and 204 of first inverter 110 and second inverter 112. FIG. 2B is a signal timing diagram depicting maintenance of respective leads 202 and 204 of first inverter 110 and second inverter 112 as ON (i.e., maintained or power supplied) or OFF (i.e., respective lead not maintained or power not supplied), and a logic state at output node 122 that controls output node 122 of FIG. 1. Generally, maintenance of respective leads 202 and 204 is indicative of supply of power to first inverter 110 or second inverter 112 being ON, respectively, and non-maintenance of leads 202 or 204 is indicative of supply of power to first inverter 110 and second inverter 112 being OFF, respectively.

At the signal timing diagram depicted by FIG. 2B, for a time duration from $T_0$ to $T_1$, indication 118 is logic low and power is supplied (i.e., power supply is ON) to first inverter 110 via lead 202. For a time duration from $T_1$ to $T_2$, indication 118 is logic high and power is not supplied (power supply is OFF) to lead 202. For a time duration from $T_2$ to $T_3$, indication 118 is logic low and power is supplied (i.e., power supply is ON) to first inverter 110 via lead 202. For the time duration from $T_0$ to $T_3$, power is supplied (i.e., power supply is ON) to second inverter 112 via lead 204.

When power supply to first inverter 110 is OFF, first inverter 110 cannot respond to falling edges of input signal 114 (i.e., a PMOS transistor source terminal is floating and so the PMOS transistor cannot pull-up the inverter output to supply voltage VDD2) nor generate an inverted input signal 114. In one or more examples, a second signal detector is provided at an input circuit to detect a falling edge of input signal 114 and turn ON first inverter 110.

Figure 3:
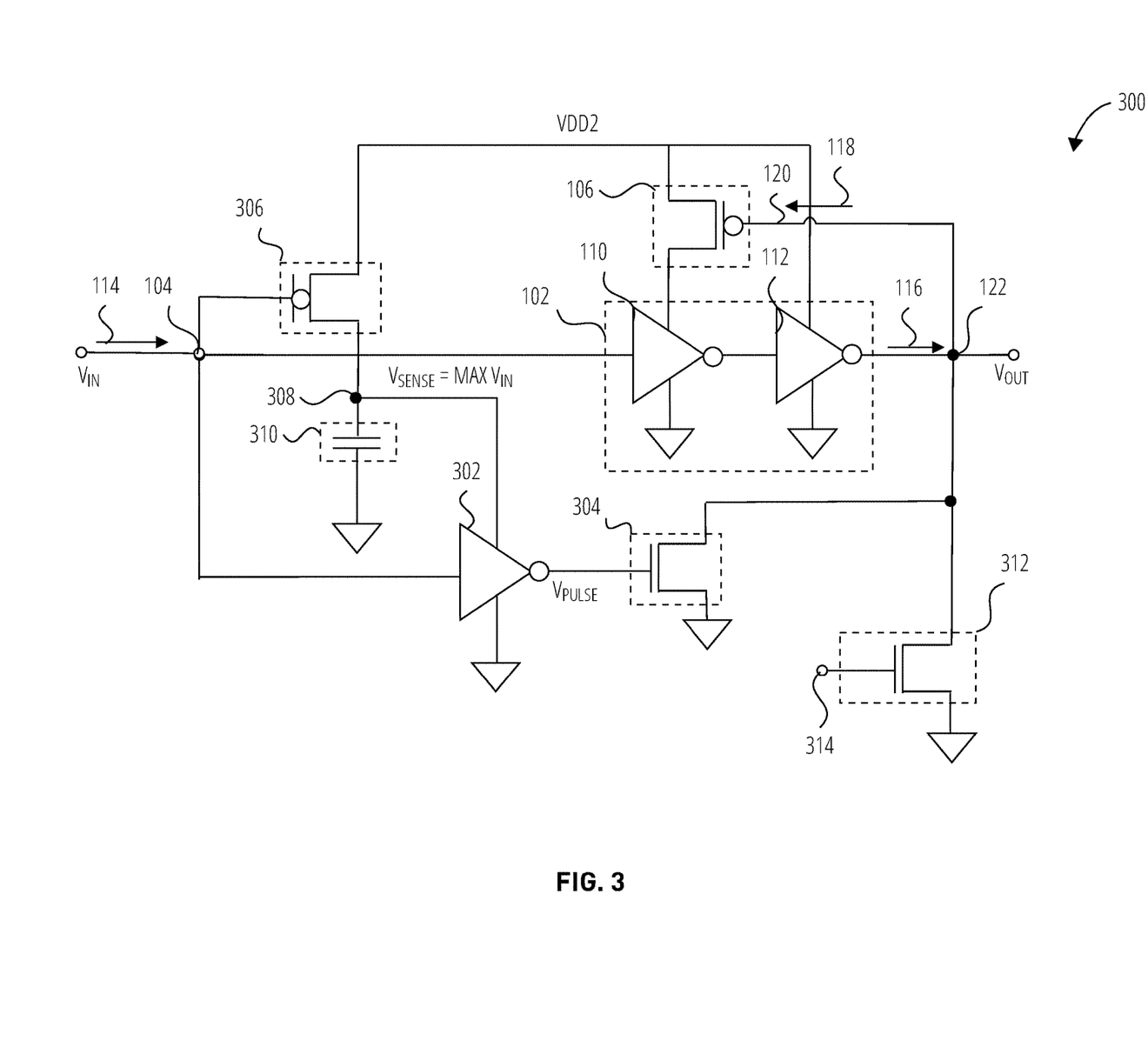
FIG. 3 is a schematic diagram depicting an input circuit, in accordance with one or more examples.

FIG. 3 is a schematic diagram depicting an input circuit 300, in accordance with one or more examples. An element depicted at input circuit 300 that bears the same reference label as an element depicted at input circuit 100 carries the same description and will not be re-described to avoid unnecessary duplication.

In one or more examples, a state of indication 118 is set responsive to a state of output signal 116. Setting indication 118 to a logic high turns OFF power switch 106 and turns OFF power supply to first inverter 110. Setting indication 118 to a logic low turns ON power switch 106 and turns ON power supply to first inverter 110.

Input circuit 300 includes third inverter 302, discharge switch 304, sense switch 306 and sense capacitor 310, arranged to detect falling edges of input signal 114 and sets indication 118 to a logic low to turn ON power switch 106 and turn ON power supply to first inverter 110. Upon receiving power supply, first inverter 110 may detect the falling edge of input signal 114 and generate a VDD2 version of an inverted input signal 114, and second inverter 112 may generate output signal 116, which is a VDD2 version of input signal 114.

Sense switch 306, sense capacitor 310, and voltage $V_{SENSE}$, are arranged to act as a VDD1 power supply to third inverter 302. Sense switch 306 is configured to be ON while gate-source voltage (Vgs) is greater than 0. In one or more examples, sense switch 306 may be a native 0-$V_t$ (zero threshold voltage) N Channel MOSFET switch, though use of other configurations of switches does not exceed the scope of this disclosure, such as a low threshold voltage MOSFET and a Schottky diode (its anode directly coupled to the input node 104, and cathode coupled to third node 308 and a top plate of sense capacitor 310).

When voltage $V_{IN}$ (the voltage representing input signal 114) increases to or represents a logic high, sense switch 306 turns ON and charges sense capacitor 310 until the voltage difference between its gate and source is substantially 0 volts (i.e., $V_{SENSE}=V_{IN}$), then turns ON as needed to maintain a voltage $V_{SENSE}$ at sense capacitor 310 equal to MAX $V_{IN}$. When voltage $V_{IN}$ decreases to or represents a logic low a voltage Vgs of sense switch 306 is negative and so sense switch 306 is OFF. Notably, a level of voltage $V_{SENSE}$ remains for at least a period of time near a level of the sensed voltage, namely, $V_{IN}$. In this manner, sense switch 306 and sense capacitor 310 utilize the supply voltage VDD2 to sense a max voltage level of $V_{IN}$ (i.e., a voltage level utilized to represent a logic high for input signal 114) to third node 308 and to a supply lead of third inverter 302.

When input signal 114 is a logic high, the supply voltage $V_{SENSE}$ at third inverter 302 substantially matches the voltage at the input of third inverter 302. Accordingly, static current is not a risk for the third inverter 302 as its maximum supply voltage is VDD1 and the input level is also VDD1. Even if supply voltage ($V_{SENSE}$) is above or below VDD1, as long as the difference is less than a threshold voltage of the PMOS switch of third inverter 302 (e.g., |500 mV| or higher, without limitation) third inverter will not experience a static current draw.

The voltage across sense capacitor 310 maintains the power supply terminal of third inverter 302 and maintained third inverter 302 may invert input signal 114, and more specifically, generate a logic high in response to a decreasing voltage at its input indicative of a falling edge of input signal 114. The output of maintained third inverter 302 is an inverter input signal 114.

The inverter input signal 114 generated by maintained third inverter 302 turns ON discharge switch 304. Discharge switch 304 is coupled between output node 122 and ground supply. When turned ON, discharge switch 304 pulls output node 122 low, setting output signal 116 and indication 118 to logic low. Setting indication 118 to logic low turns ON power switch 106 and turns ON power supply to first inverter 110. Once enabled, first inverter 110 may invert a logic low represented by a VDD1 voltage at its input to a logic high at its output represented by a VDD2 voltage, which is inverted by second inverter 112 to generate output signal 116, which is an input signal 114 represented by a VDD2 voltage.

For initialization of indication 118, optional reset switch 312 is provided that turns ON in response to assertion of a power-ON signal at terminal 314 of reset switch 312 utilized to power input circuit 300. Power-ON signal happens when power/supply voltage is applied/ramped to input circuit 300 from 0V. When reset switch 312 turns on, it pulls output node 122 low and sets the output signal 116 to a logic low, which, as discussed above, sets indication 118 low and turns ON power switch 106 and supply of power to first inverter 110.

Figure 4:
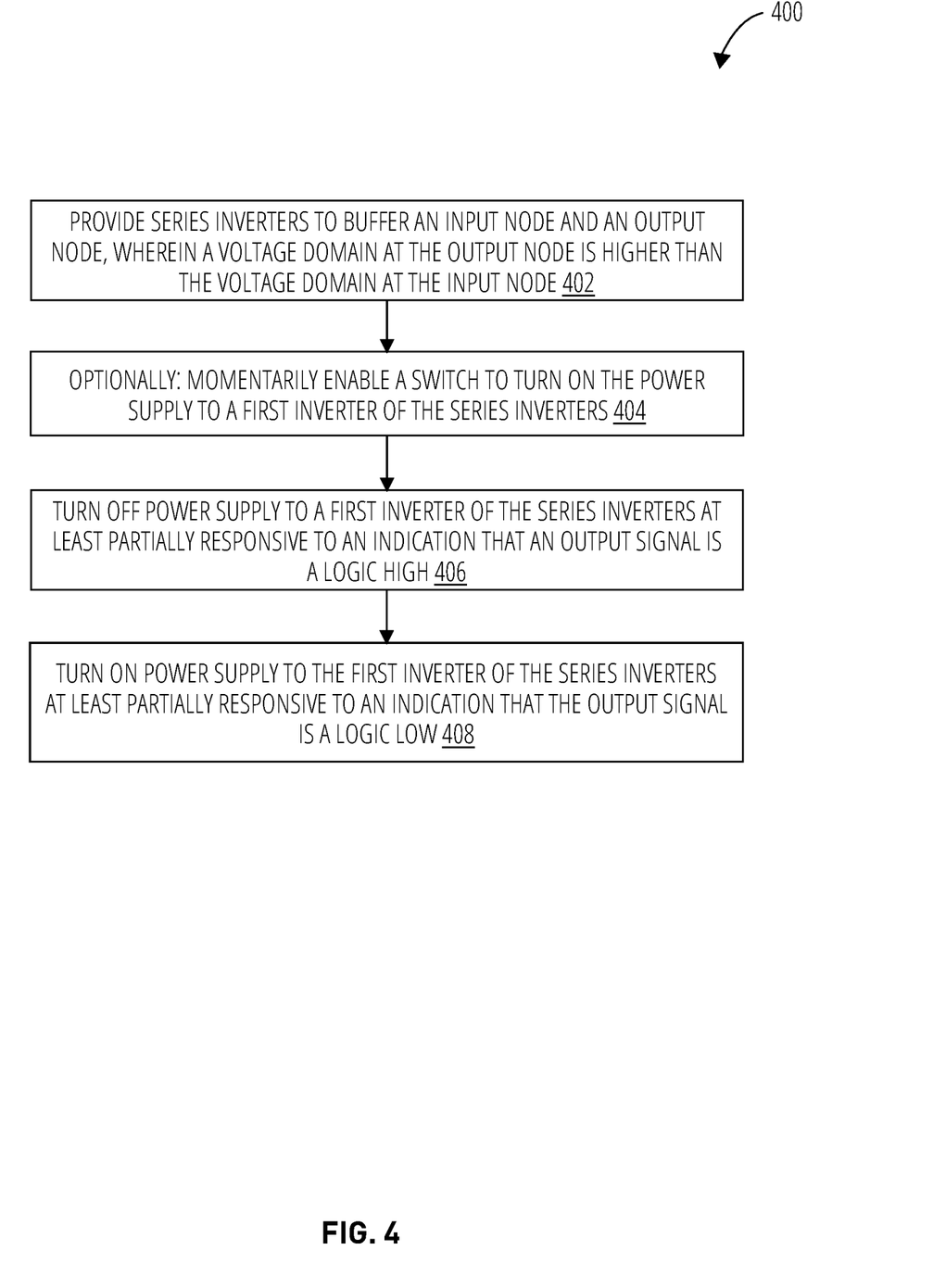
FIG. 4 is a flow diagram depicting a process that reduces leakage current series inverters buffering an input signal, in accordance with one or more examples.

FIG. 4 is a flow diagram depicting a process 400 that reduces leakage current series inverters buffering an input signal, in accordance with one or more examples.

At operation 402, process 400 provides series inverters (e.g., series inverters 102) to buffer an input node (e.g., input node 104) and an output node (e.g., output node 122). A voltage domain at the output node (e.g., second voltage domain 108) is higher than the voltage domain at the input node (e.g., first voltage domain 124).

At operation 404, process 400 optionally momentarily enables a switch (e.g., reset switch 312) to turn ON the power supply to a first inverter (e.g., first inverter 110 of series inverters 102). In one or more examples, operation 404 may be or be responsive to a power-ON of input circuit 300.

At operation 406, process 400 turns OFF power supply to a first inverter (e.g., first inverter 110) of the series inverters (e.g., series inverters 102) at least partially responsive to an indication (e.g., indication 118) that an output signal (e.g., output signal 116) is a logic high.

At operation 408, turn ON power supply to the first inverter (e.g., first inverter 110) of the series inverters (e.g., series inverters 102) at least partially responsive to an indication (e.g., indication 118) that an output signal (output signal 116) is a logic low. In one or more examples, the indication that output signal 116 is a logic low may, alternatively or additionally, be an indication of detection of a falling edge of input signal 114 or of a decreasing voltage at an input of third inverter 302.

Figure 5:
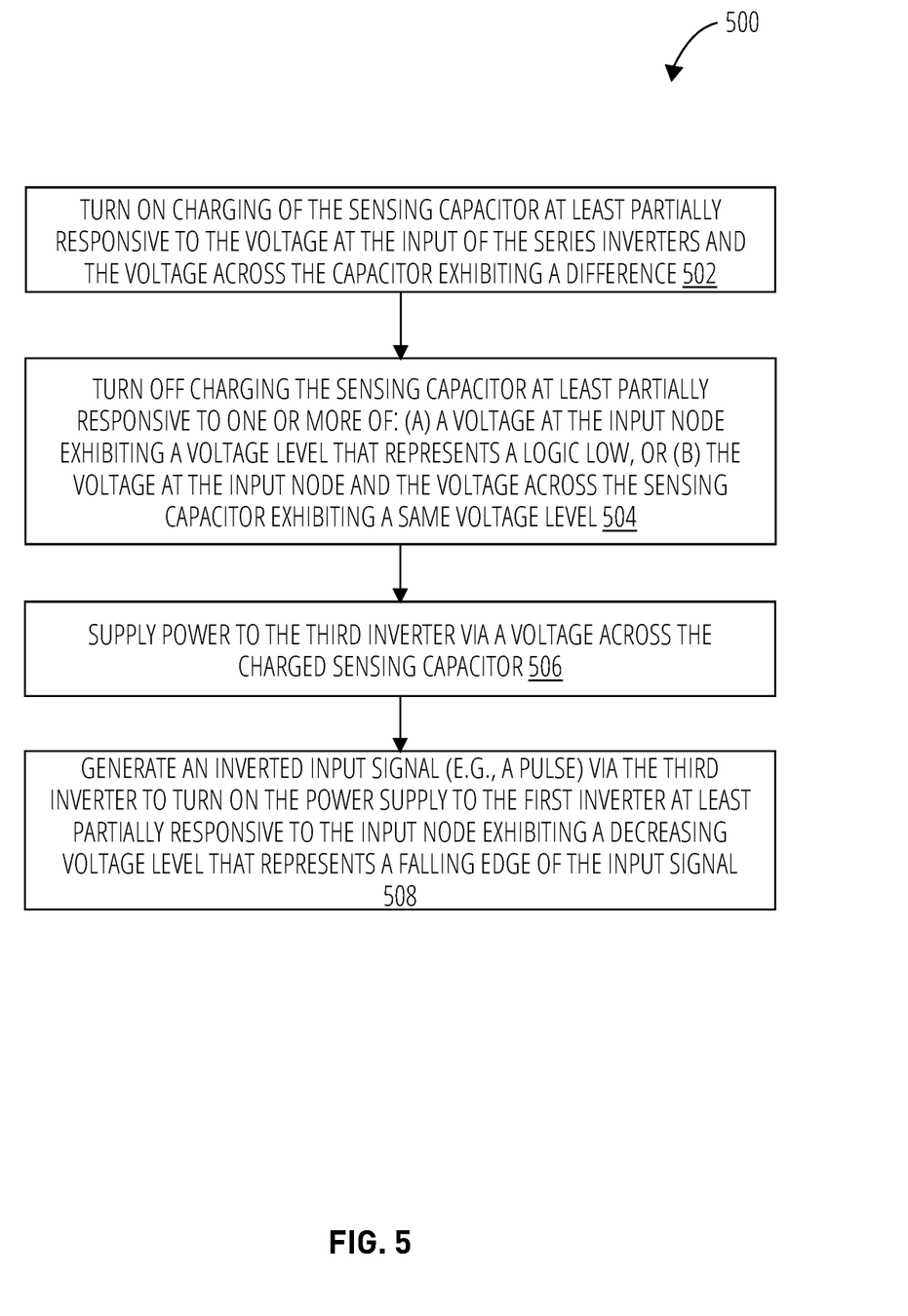
FIG. 5 is a flow diagram depicting a process for setting an indication that an output signal is a logic low, in accordance with one or more examples.

FIG. 5 is a flow diagram depicting a process 500 for setting an indication that an output signal is a logic low, in accordance with one or more examples.

At operation 502, process 500 turns ON charging a sense capacitor (e.g., sense capacitor 310) to a third inverter (e.g., third inverter 302) at least partially responsive to the voltage at the input node (e.g., of series inverters 102) exhibiting a voltage level that represents a logic high.

At operation 504, process 500 turns OFF charging the sense capacitor (e.g., sense capacitor 310) at least partially responsive to one or more of: (a) the voltage at the input node (e.g., input node 104) exhibiting a voltage level that represents a logic low, or (b) a voltage across the capacitor exhibiting a voltage level that substantially matches a voltage level exhibited at the input node.

At operation 506, process 500 supplies power to the third inverter (e.g., third inverter 302) via a voltage across the sense capacitor (e.g., sense capacitor 310).

At operation 508, process 500 generates an inverted input signal (e.g., a pulse) via the third inverter (e.g., third inverter 302) to turn ON the power supply to the first inverter (e.g., first inverter 110) at least partially responsive to the input node (e.g., input node 104) exhibiting the decreasing voltage level that represents a falling edge of the input signal (e.g., input signal 114).

Figure 6:
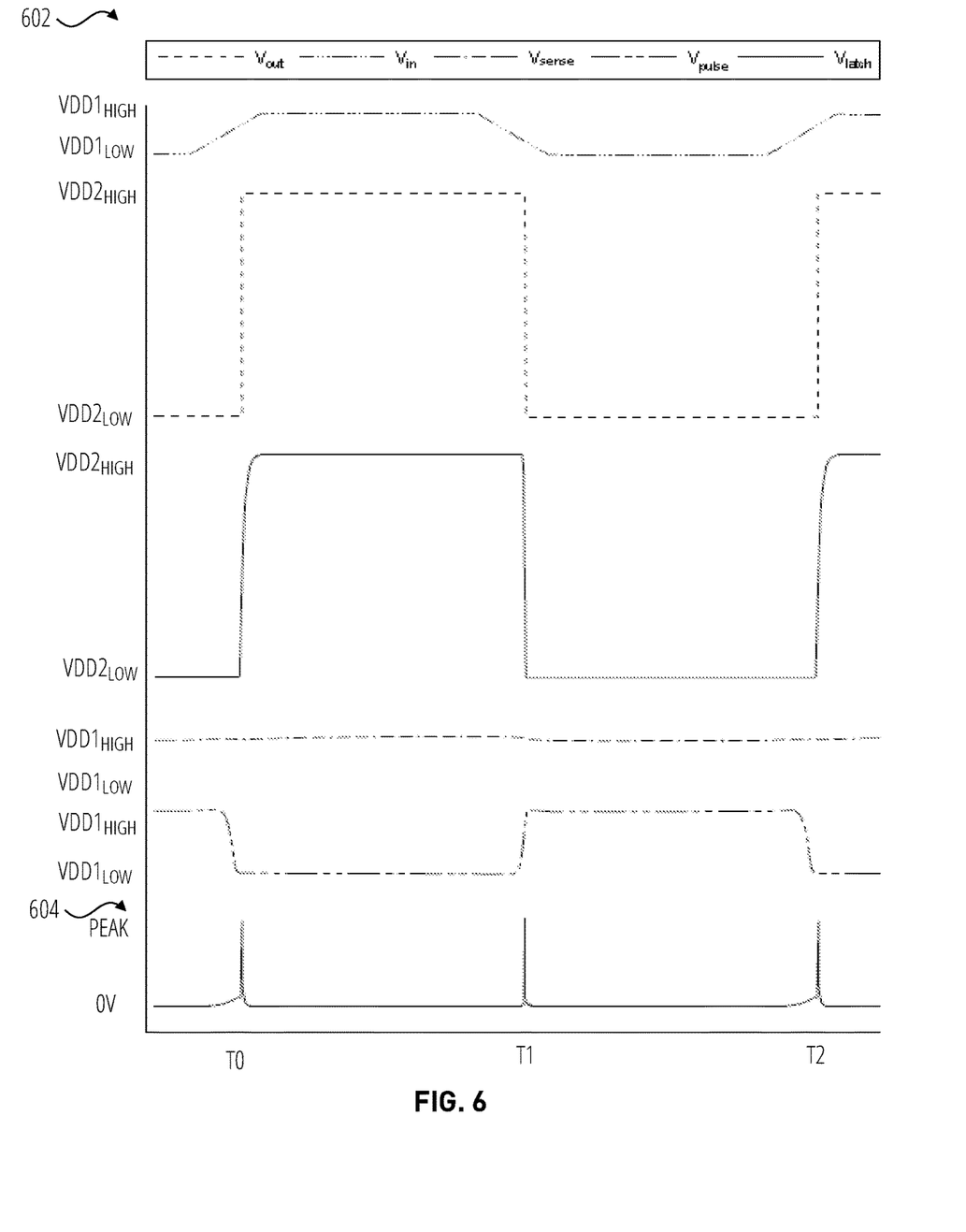
FIG. 6 is a signal diagram depicting voltage signals from a simulation of input circuit in accordance with one or more examples.

FIG. 6 is a signal diagram for a non-limiting example operation of input circuit 300 that includes a diagram 602 depicting values of voltage signals for $V_{IN}$, $V_{OUT}$, $V_{LATCH}$ (latched $V_{OUT}$), $V_{SENSE}$, and $V_{PULSE}$ and a diagram 604 depicting values of static current draw at series inverters 102 during the example operation. Voltage levels $VDD1_{HIGH}$ and $VDD1_{LOW}$ are used in FIG. 6 to represent voltage levels for logic levels of $V_{IN}$, and voltage levels $VDD2_{HIGH}$ and $VDD2_{LOW}$ are used in FIG. 6 to represent voltage levels for logic levels of input circuit 300. As depicted by FIG. 6, $V_{IN}$ exhibits a rising edge at time $T_0$, a falling edge at time $T_1$, and a rising edge at time $T_2$. At about time $T_0$, $V_{OUT}$ is set to $VDD2_{HIGH}$ and is latched. Notably, while VIN is $VDD1_{LOW}$, no or negligible static current draw is exhibited at series inverters 102. At time $T_0$, when the rising edge of $V_{IN}$ is detected and $V_{OUT}$ is set to $VDD2_{HIGH}$ static current draw is present at first inverter 110 but it is momentary due to power supply to first inverter 110 turning OFF in response to $V_{OUT}$ set to $VDD2_{HIGH}$. At about time $T_1$, $V_{PULSE}$ is set to $VDD1_{HIGH}$ (e.g., by third inverter 302 detecting the falling edge of $V_{IN}$, without limitation), sets $V_{OUT}$ to $VDD2_{LOW}$ (e.g., turns on discharge switch 304 which pulls down the voltage at output node 122, without limitation), and turns ON power supply to first inverter 110. At time $T_1$, when power supply to first inverter 110 is turned ON and first inverter 110 changes from output of a $VDD1_{LOW}$ to $VDD1_{HIGH}$, static current draw is present at first inverter 110 but it is momentary due to the PMOS transistor of first inverter 110 turning ON and providing VDD2 to the inverter output.

Notably, an input circuit in accordance with one or more examples (e.g., input circuit 100 or input circuit 300, without limitation) will recognize input signals that are represented by voltage levels of VDD2, though risk of static current draw at the first inverter may be negligible or non-existent. Although various examples discussed herein may be for cases where logic levels of an input signal are represented by voltage levels that are lower than voltage levels utilized to represent logic levels at an input circuit or output node of an input circuit, utilization of input circuits in accordance with one or more examples in cases where input signals are represented by voltage levels that are substantially the same as voltage levels utilized to represent logic level signals at the input circuit is specifically contemplated and does not exceed the scope of this disclosure. Further, input circuits in accordance with one or more examples may be utilized as output circuits, as a non-limiting example, interfacing a lower voltage domain with a high voltage domain without exceeding the scope of this disclosure.

Figure 7:
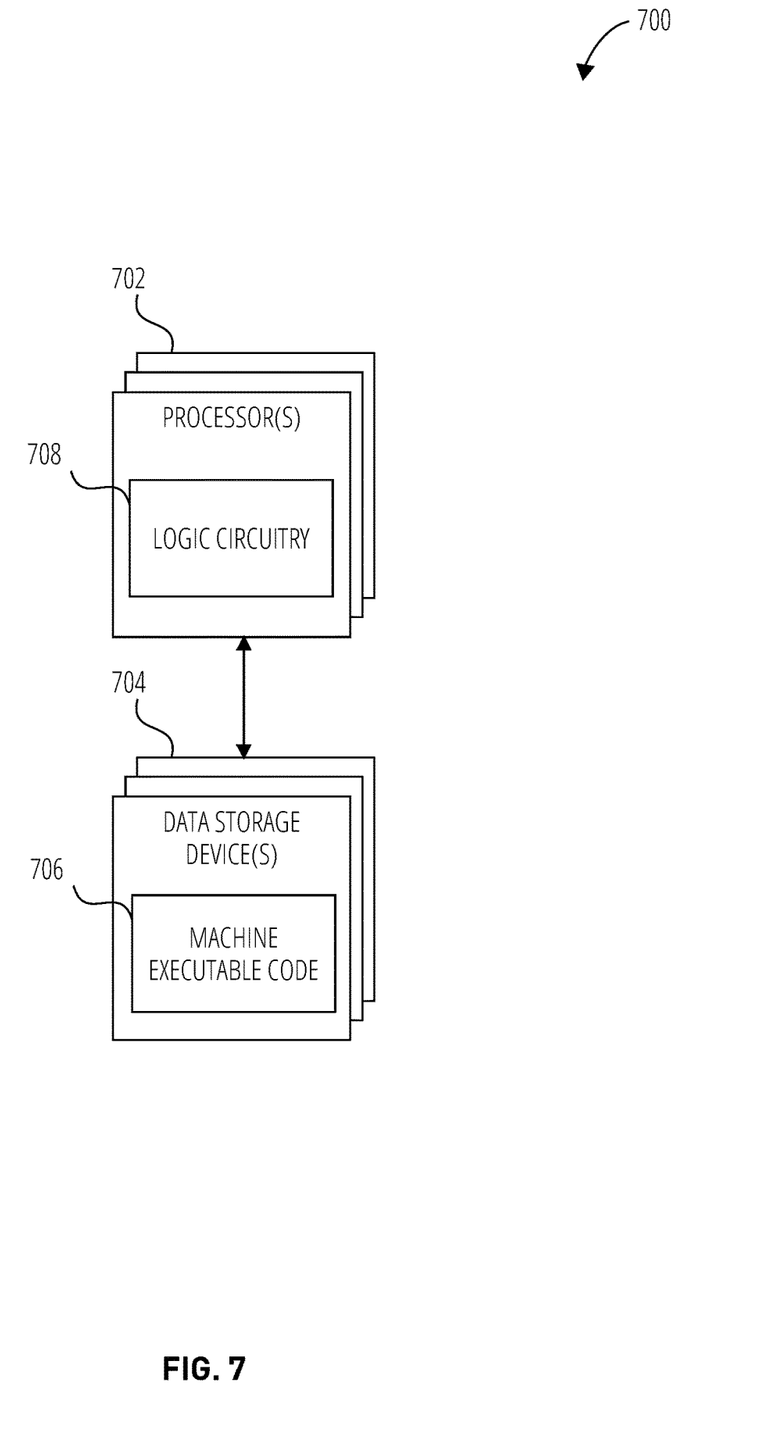
FIG. 7 is a block diagram of circuitry that, in some examples, may be used to implement various functions, operations, acts, processes, or methods disclosed herein.

FIG. 7 is a block diagram of circuitry 700 that, in some examples, may be used to implement various functions, operations, acts, processes, or methods disclosed herein. Circuitry 700 includes one or more processors 702 (sometimes referred to herein as "processors 702") operably coupled to one or more apparatuses such as data storage devices (sometimes referred to herein as "storage 704"), without limitation. Storage 704 includes machine executable code 706 stored thereon (e.g., stored on a computer-readable memory) and processors 702 include logic circuitry 708. Machine executable code 706 include information describing functional elements that may be implemented by (e.g., performed by) logic circuitry 708. Logic circuitry 708 is adapted to implement (e.g., perform) the functional elements described by machine executable code 706. Circuitry 700, when executing the functional elements described by machine executable code 706, should be considered as special purpose hardware configured for carrying out functional elements disclosed herein. In some examples, processors 702 may be configured to perform the functional elements described by machine executable code 706 sequentially, concurrently (e.g., on one or more different hardware platforms), or in one or more parallel process streams.

When implemented by logic circuitry 708 of processors 702, machine executable code 706 is configured to adapt processors 702 to perform operations of examples disclosed herein. For example, machine executable code 706 may be configured to adapt processors 702 to perform at least a portion or a totality of process 400 or process 500. As another example, machine executable code 706 may be configured to adapt processors 702 to perform at least a portion or a totality of the operations discussed with reference to input circuit 100 or input circuit 300.

Processors 702 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute computing instructions (e.g., software code) related to examples of the present disclosure. It is noted that a general-purpose processor (may also be referred to herein as a host processor or simply a host) may be a microprocessor, but in the alternative, processors 702 may include any conventional processor, controller, microcontroller, or state machine. Processors 702 may also be implemented as a combination of computing devices, such as a combination of a DSP and a microprocessor, a plurality of microprocessors, one or more microprocessors in conjunction with a DSP core, or any other such configuration.

In some examples storage 704 includes volatile data storage (e.g., random-access memory (RAM)), non-volatile data storage (e.g., Flash memory, a hard disc drive, a solid state drive, erasable programmable read-only memory (EPROM), without limitation). In some examples processors 702 and storage 704 may be implemented into a single device (e.g., a semiconductor device product, a system on chip (SOC), without limitation). In some examples processors 702 and storage 704 may be implemented into separate devices.

In some examples, machine executable code 706 may include computer-readable instructions (e.g., software code, firmware code). By way of non-limiting example, the computer-readable instructions may be stored by storage 704, accessed directly by processors 702, and executed by processors 702 using at least logic circuitry 708. Also by way of non-limiting example, the computer-readable instructions may be stored on storage 704, transmitted to a memory device (not shown) for execution, and executed by processors 702 using at least logic circuitry 708. Accordingly, in some examples logic circuitry 708 includes electrically configurable logic circuitry 708.

In some examples machine executable code 706 may describe hardware (e.g., circuitry) to be implemented in logic circuitry 708 to perform the functional elements. This hardware may be described at any of a variety of levels of abstraction, from low-level transistor layouts to high-level description languages. At a high-level of abstraction, a hardware description language (HDL) such as an Institute of Electrical and Electronics Engineers (IEEE) Standard hardware description language (HDL) may be used, without limitation. By way of non-limiting examples, VERILOG®, SystemVerilog™ or very large scale integration (VLSI) hardware description language (VHDL) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of logic circuitry 708 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples machine executable code 706 may include an HDL, an RTL, a GL description, a mask level description, other hardware description, or any combination thereof.

In examples where machine executable code 706 includes a hardware description (at any level of abstraction), a system (not shown, but including storage 704) may be configured to implement the hardware description described by machine executable code 706. By way of non-limiting example, processors 702 may include a programmable logic device (e.g., an FPGA or a PLC) and logic circuitry 708 may be electrically controlled to implement circuitry corresponding to the hardware description into logic circuitry 708. Also by way of non-limiting example, logic circuitry 708 may include hard-wired logic manufactured by a manufacturing system (not shown, but including storage 704) according to the hardware description of machine executable code 706.

Regardless of whether machine executable code 706 includes computer-readable instructions or a hardware description, logic circuitry 708 is adapted to perform the functional elements described by machine executable code 706 when implementing the functional elements of machine executable code 706. It is noted that although a hardware description may not directly describe functional elements, a hardware description indirectly describes functional elements that the hardware elements described by the hardware description are capable of performing.

In one or more examples, voltage thresholds (and hysteresis for input circuit 100 and input circuit 300 more generally) for detecting rising and falling edges can be set by configuring voltage threshold characteristics of a first digital logic inverter that is a first inverter 110 and third digital logic inverter that is an inverter 302. As a non-limiting example, a first digital logic inverter 110 and a third digital logic inverter 302 may be formed by arranging complimentary devices in a complimentary metal-oxide-semiconductor (CMOS) configuration (i.e., a CMOS type inverter) and the size of respective N and P channels of respective devices may be chosen to have desirable voltage thresholds.

As used in the present disclosure, the terms "module" or "component" may refer to specific hardware implementations configured to perform the actions of the module or component or software objects or software routines that may be stored on or executed by general purpose hardware (e.g., computer-readable media, processing devices, without limitation) of the computing system. In some examples, the different components, modules, engines, and services described in the present disclosure may be implemented as objects or processes that execute on the computing system (e.g., as separate threads, without limitation). While some of the system and methods described in the present disclosure are generally described as being implemented in software (stored on or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means some or a totality. As used herein, the term "each and every" means a totality.

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Any characterization in this description of something as 'typical,' 'conventional,' 'known,' 'typical,' or the like does not necessarily mean that it is disclosed in the prior art or that the discussed aspects are appreciated in the prior art. Nor does it necessarily mean that, in the relevant field, it is widely known, well-understood, or routinely used.

Additional non-limiting examples of the disclosure include:

Example 1: A method, comprising: providing series inverters to buffer an input node and an output node, wherein a voltage domain at the output node is higher than the voltage domain at the input node; turning OFF power supply to a first inverter of the series inverters at least partially responsive to an indication that an output signal is a logic high; and turning ON power supply to the first inverter of the series inverters at least partially responsive to an indication that the output signal is a logic low.

Example 2: The method according to Example 1, comprising: generating a voltage pulse via a third inverter to turn ON the power supply to the first inverter at least partially responsive to the input node exhibiting a decreasing voltage level that represents a falling edge of an input signal.

Example 3: The method according to any of Examples 1 and 2, comprising: charging a sense capacitor; and supplying power to the third inverter via a voltage across the sense capacitor.

Example 4: The method according to any of Examples 1 through 3, comprising: turning ON charging the sense capacitor at least partially responsive to the voltage at the input node and the voltage across the sense capacitor exhibiting different voltage levels.

Example 5: The method according to any of Examples 1 through 4, comprising: turning OFF charging the sense capacitor at least partially responsive to the voltage at the input node and the voltage across the sense capacitor exhibiting a same voltage level.

Example 6: The method according to any of Examples 1 through 5, comprising: maintaining a second inverter of the series inverters when the power supply to the first inverter is turned OFF and when the power supply to the first inverter is turned ON.

Example 7: The method according to any of Examples 1 through 6, comprising: enabling a reset switch to turn ON the power supply to the first inverter.

Example 8: An apparatus, comprising: series inverters selectively coupled to provide a buffer between an input node and an output node, wherein a voltage domain of the input node is different than a voltage domain of the series inverters; and a power switch arranged to: turn OFF power supply to a first inverter of the series inverters at least partially responsive to an indication that an output signal is a logic high; and turn ON power supply to the first inverter of the series inverters at least partially responsive to an indication that the output signal is a logic low.

Example 9: The apparatus according to Example 8, comprising: a power supply and a supply lead of a second inverter of the series inverters coupled to supply power to the second inverter.

Example 10: The apparatus according to any of Examples 8 and 9, wherein the power supply and supply lead of the second inverter are coupled to maintain the second inverter both when the power supply to the first inverter is OFF and when the power supply to the first inverter is ON.

Example 11: The apparatus according to any of Examples 8 through 10, comprising: a third inverter and a discharge switch coupled to turn ON the power switch at least partially responsive to the input node exhibiting a decreasing voltage level that represents a falling edge of an input signal.

Example 12: The apparatus according to any of Examples 8 through 11, comprising: a sense capacitor to store a voltage for maintaining a supply lead of the third inverter.

Example 13: The apparatus according to any of Examples 8 through 12, comprising: a sense switch arranged to: turn ON charging the sense capacitor at least partially responsive to the voltage at the input node and the voltage across the sense capacitor exhibiting a difference; and turn OFF charging the sense capacitor at least partially responsive to the voltage at the input node and the voltage across the sense capacitor exhibiting a same voltage level.

Example 14: The apparatus according to any of Examples 8 through 13, wherein: the third inverter arranged to generate a voltage pulse at least partially responsive to the input node exhibiting the decreasing voltage level that represents a falling edge of the input signal.

Example 15: The apparatus according to any of Examples 8 through 14, wherein: a voltage level of the voltage pulse is substantially same as a voltage level utilized to represent a logic high for the input signal.

Example 16: The apparatus according to any of example 8 through 14, wherein the first inverter is a digital logic inverter, the second inverter is a digital logic inverter, and a third inverter is a digital logic inverter.

Example 17: The apparatus according to any of example 8 through 14, wherein a desired hysteresis for the input circuit is set at least partially based on a chosen channel sizes of respective transistors of one or more of first inverter, second inverter or third inverter.

Example 18: The apparatus according to any of example 8 through 14, wherein voltage thresholds for detecting rising and falling edges are configured at the first transistor and the third transistor at least partially based on chosen channel sizes respective transistors of the first transistor and the second transistor.

The features of the various examples described herein are not mutually exclusive and can exist in various combinations and permutations, even if such combinations or permutations are not expressly described herein, without departing from the scope of the disclosure. In fact, variations, modifications, and other implementations of what is described herein will occur to one of ordinary skill in the art without departing from the scope of the disclosure. As such, the invention is not to be defined only by the preceding illustrative description, but only by the claims which follow, and legal equivalents thereof.

We claim:

1. A method, comprising:
providing series inverters to buffer an input node and an output node, wherein a voltage domain at the output node is higher than the voltage domain at the input node;
turning OFF power supply to a first inverter of the series inverters at least partially responsive to an indication that an output signal at the output node is a logic high; and
turning ON power supply to the first inverter of the series inverters with assistance of a third inverter at least partially responsive to an indication that the output signal is a logic low.

2. The method of claim 1, comprising:
generating a voltage pulse via the third inverter to turn ON the power supply to the first inverter at least partially responsive to the input node exhibiting a decreasing voltage level that represents a falling edge of an input signal.

3. The method of claim 1, comprising:
maintaining a second inverter of the series inverters when the power supply to the first inverter is turned OFF and when the power supply to the first inverter is turned ON.

4. The method of claim 1, comprising:
enabling a reset switch to turn ON the power supply to the first inverter.

5. A method, comprising:
providing series inverters to buffer an input node and an output node, wherein a voltage domain at the output node is higher than the voltage domain at the input node;
turning OFF power supply to a first inverter of the series inverters at least partially responsive to an indication that an output signal is a logic high;
turning ON charging a sense capacitor at least partially responsive to the voltage at the input node and the voltage across the sense capacitor exhibiting different voltage levels;
supplying power to a third inverter via a voltage across the sense capacitor; and
generating a voltage pulse via the third inverter to turn ON power supply to the first inverter at least partially responsive to the input node exhibiting a decreasing voltage level that represents a falling edge of an input signal.

6. The method of claim 5, comprising:
turning OFF charging the sense capacitor at least partially responsive to the voltage at the input node and the voltage across the sense capacitor exhibiting a same voltage level.

7. An apparatus, comprising:
series inverters selectively coupled to provide a buffer between an input node and an output node, wherein a voltage domain of the input node is different than a voltage domain of the series inverters;
a power switch arranged to:
turn OFF power supply to a first inverter of the series inverters at least partially responsive to an indication that an output signal at the output node is a logic high; and
turn ON power supply to the first inverter of the series inverters at least partially responsive to an indication that the output signal is a logic low; and
a third inverter to assist with power supply turn ON to the first inverter.

8. The apparatus of claim 7, comprising:
a power supply and a supply lead of a second inverter of the series inverters coupled to supply power to the second inverter.

9. The apparatus of claim 8, wherein the power supply and supply lead of the second inverter are coupled to maintain the second inverter both when the power supply to the first inverter is OFF and when the power supply to the first inverter is ON.

10. The apparatus of claim 7, comprising:
the third inverter and a discharge switch coupled to turn ON the power switch at least partially responsive to the input node exhibiting a decreasing voltage level that represents a falling edge of an input signal.

11. An apparatus, comprising:
series inverters selectively coupled to provide a buffer between an input node and an output node, wherein a voltage domain of the input node is different than a voltage domain of the series inverters;
a power switch arranged to:
turn OFF power supply to a first inverter of the series inverters at least partially responsive to an indication that an output signal is a logic high; and
turn ON power supply to the first inverter of the series inverters at least partially responsive to an indication that the output signal is a logic low;
a third inverter and a discharge switch coupled to turn ON the power switch at least partially responsive to the input node exhibiting a decreasing voltage level that represents a falling edge of an input signal; and
a sense capacitor to store a voltage for maintaining a supply lead of the third inverter.

12. The apparatus of claim 11, comprising:
a sense switch arranged to:
turn ON charging the sense capacitor at least partially responsive to the voltage at the input node and the voltage across the sense capacitor exhibiting a difference; and
turn OFF charging the sense capacitor at least partially responsive to the voltage at the input node and the voltage across the sense capacitor exhibiting a same voltage level.

13. The apparatus of claim 11, wherein:
the third inverter arranged to generate a voltage pulse at least partially responsive to the input node exhibiting the decreasing voltage level that represents a falling edge of the input signal.

14. The apparatus of claim 13, wherein:
a voltage level of the voltage pulse is substantially same as a voltage level utilized to represent a logic high for the input signal.

* * * * *